United States Patent [19]
Piazza

[11] Patent Number: 5,814,761
[45] Date of Patent: Sep. 29, 1998

[54] PASSIVE EMI DISSIPATION APPARATUS AND METHOD

[75] Inventor: Benjamin J. Piazza, Venice, Calif.

[73] Assignee: Shakti Audio Innovations, Pacific Palisades, Calif.

[21] Appl. No.: 525,941

[22] Filed: Sep. 7, 1995

[51] Int. Cl.[6] .................................................... H05K 9/00
[52] U.S. Cl. .......................................... 174/35 R; 330/68
[58] Field of Search ............................ 174/35 R, 35 MS; 361/816, 818; 336/84 M; 330/68, 170; 313/313, 356

[56] References Cited

U.S. PATENT DOCUMENTS

| | | | |
|---|---|---|---|
| 3,626,345 | 12/1971 | Funski | 336/84 M |
| 5,206,796 | 4/1993 | Thompson et al. | 361/424 |
| 5,239,126 | 8/1993 | Oshiba | 174/35 R |
| 5,313,371 | 5/1994 | Knecht et al. | 361/818 |
| 5,621,263 | 4/1997 | Kaida | 310/333 |

FOREIGN PATENT DOCUMENTS

| | | | |
|---|---|---|---|
| 64-122842 | 12/1990 | Japan | 174/35 R |
| 2-21796 | 10/1991 | Japan | 174/35 R |

*Primary Examiner*—Bot L. Ledynh
*Assistant Examiner*—Hung V. Ngo
*Attorney, Agent, or Firm*—John S. Christopher

[57] ABSTRACT

A passive Electromagnetic Interference (EMI) dissipation apparatus typically utilized with an active host component to reduce self-generated and externally-generated electromagnetic interference and to improve the performance of the host component is disclosed. The apparatus includes a housing and a circuit located within the housing. The circuit includes a plurality of pyramidal-shaped resonating chambers having internally conductive surfaces covered with a layer of electrically resistive material, a plurality of quartz resonators each mounted upon a damping compound, and a plurality of permanent magnets each including a magnetically permeable bar. The electromagnetic interference is dissipated in the circuit over a broad range of frequencies in the form of heat. In a preferred embodiment, the plurality of permanent magnets and the corresponding plurality of permeable bars are mounted within a common chamber located immediately below the base of each of the pyramidal-shaped resonating chambers. Each of the quartz resonators is placed upon a separate portion of viso-elastic damping compound arranged upon one of a pair of non-conductive plates. The pair of plates are then manipulated so as to sandwich the pyramidal-shaped resonating chambers and the permanent magnets and corresponding permeable bars. The sandwiched combination forms the circuit which dissipates the electromagnetic interference and is then positioned and sealed within the non-conductive housing.

12 Claims, 3 Drawing Sheets

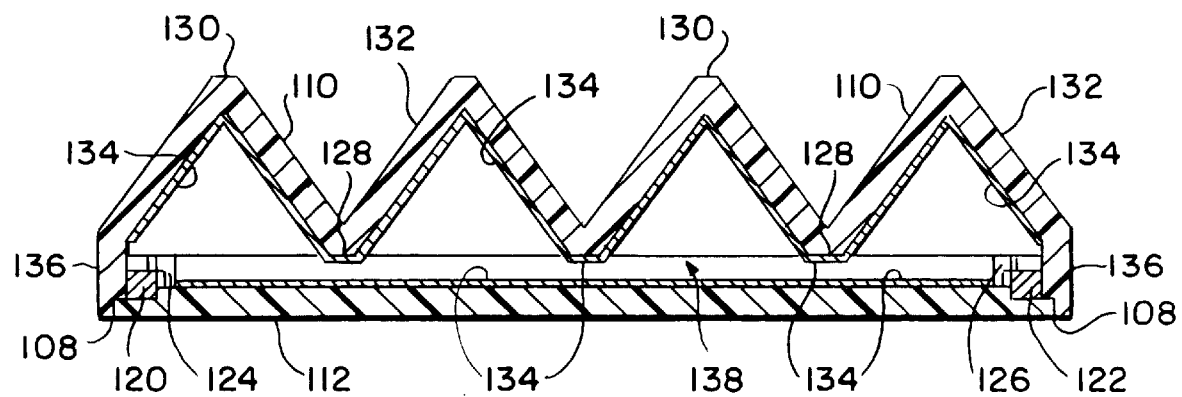
FIG. 5
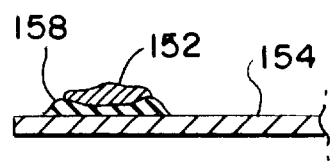
FIG. 6
FIG. 7
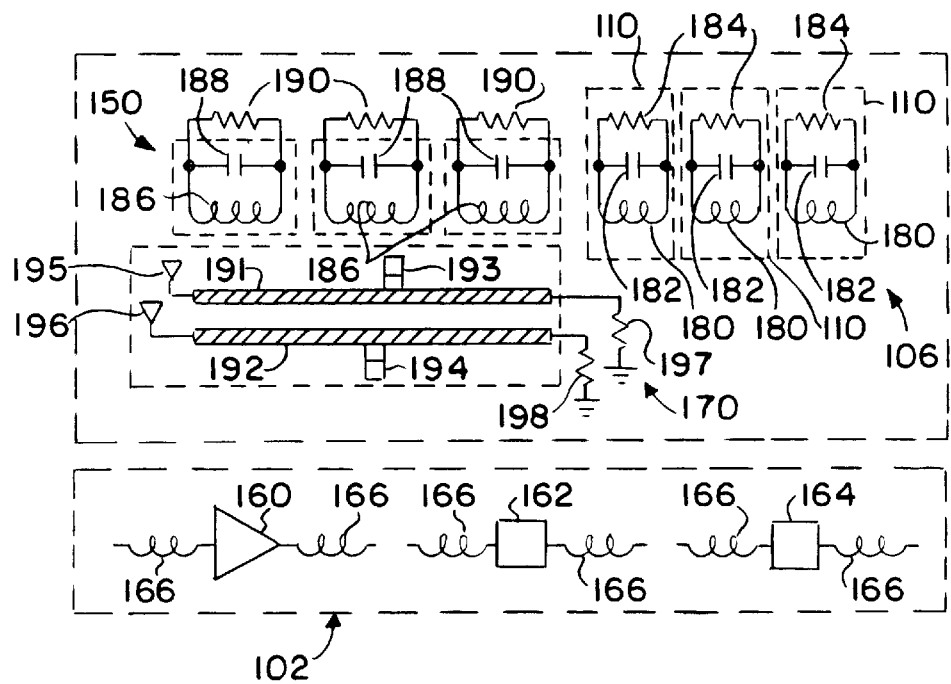

PASSIVE EMI DISSIPATION APPARATUS AND METHOD

BACKGROUND OF THE INVENTION

1. Field of the Invention

The present invention relates to passive electromagnetic interference dissipation devices. More specifically, the present invention relates to methods and apparatus for reducing electromagnetic interference in an active host component and for improving the performance thereof.

2. Description of the Related Art

Electromagnetic fields exist naturally in nature and are also generated in electromagnetic equipment operated in our environment. In a broad sense, an electromagnetic field is a category of fields that contain electrical and magnetic components over a wide range of frequencies including those in the microwave and radio frequency (RF) ranges.

Active circuits, including active audio components found in audio entertainment equipment, are circuits that are exposed to and/or generate electromagnetic fields. Active circuits, by their nature, generate Electromagnetic Interference referred to in the art as EMI. As an example, active circuits as they relate to active audio components include, but are not limited to, pre-amplifiers, power amplifiers, compact disc (CD) players, transports both integrated and separate, digital-to-analog converters, interface devices, turn tables, audio tape recorders and the like. Thus, any active audio component that can self-generate or function as an antenna for RF, microwave, electric or magnetic spurious fields can generate EMI.

EMI generally results from the negative interaction of these spurious fields with the transfer function of active signal path circuitry. These spurious RF, microwave, electric and magnetic fields radiate from several millimeters to several feet around the chassis of an active audio component referred to as the host component. Left unattenuated, undesirable components of the electromagnetic field can propagate back into the active circuits of the host component generating noise artifacts that are amplified with the music waveform. This action can result in a noisier, grainier background signal level during periods of inter-transient silence and a reduction in dynamic contrasts as audio signal levels change. By reducing these noise sources, the overall reproduction of the music becomes more detailed encompassing greater stage depth, width and clarity.

The category of EMI includes what is identified as "parasitic oscillations" which are subtle but audible noise components. These extremely short, tiny bursts of energy are visible on high resolution waveform monitors at certain points along the cycle of a sine wave. Often originating in the RF region of the electromagnetic spectrum, they are accompanied by harmonics that reflect up and down into the audio bands and become amplified at high levels along with the music waveform. The parasitic oscillations can also be external in origin since circuit stages and circuit path traces serve as a giant maze antenna. For example, metropolitan areas are teeming with radio frequency interference (RFI) ranging in frequency from 30 Hz to 7 GHz. Automotive ignition noise dominates this category but occasionally is superseded by power distribution lines. Other sources of RFI include appliances, electric motors, fluorescent lights, electric light dimmers and door openers, industrial equipment and microwave appliances.

In active audio components, self-generated parasitic oscillations are known to occur in switching power supplies. Also, capacitive input design power supplies produce 120 Hz current "spikes" caused by rectifier conduction. Common rectifier diodes utilized in many different types of equipment generate high levels of RFI. Harmonics of these current "spikes" and bursts can be detected in a wide spectrum up to 2 MHz. Radiations of these pulses are conducted to other circuit parts within the amplifier increasing the noise level as a result of being amplified in combination with the desired music signal. In effect, there are a number of parasitic oscillation transmitters within amplifiers that can produce broad bandwidth, multiple harmonic pulses each second.

Printed circuit boards (PCB's) are also sources of undesirable EMI. Several reasons that PCB's are sources of EMI include common impedance coupling via power and ground signal path traces, antenna loops formed by integrated circuits and their bypass capacitors and interaction between the electromagnetic fields of adjoining signal path traces of individual or adjacent PCB's. Further, evidence suggests that poorly soldered or cold solder connections and dissimilar adjacent metals can be sources of interference. Digital equipment is also sensitive to the presence of EMI. Clock frequency division circuits and fast logic chips are adversely affected if undesirable oscillations interfere with their exacting processing circuits. These types of circuits are included, for example, within digital-to-analog converters located within compact disc players. Thus, the crux of the parasitic oscillations problem and the resulting EMI as it relates to active audio components is the production of additional noise which is amplified along with the desired music waveform.

Several traditional approaches have been employed in the past to reduce the external RFI that propagates to active audio components. Examples include utilizing extensive chassis shielding, ferrite bead type filters at the input and output sections and power line conditioners. The length of signal path traces are usually kept short to minimize stray inductances and capacitances which can cause signals to ring and to overshoot or undershoot steady state voltage levels, each of which can be a source of EMI. It is known in the art to place ferrite bead devices around system interconnects to filter RFI that could enter at the interconnect points. This method is effective in reducing RF that can enter through exterior wiring. However, this method neither attenuates self-generated sources within the active audio component nor reduces high frequency microwave fields. Furthermore, ferrite material filters are only applicable to situations in which the ferrite filter can be placed around a wire to facilitate the impedance shifting effect, which is central to the ferrite design.

A second method employed to dissipate undesirable emanations of interference around power transformers is known. This method employs a structure that utilizes non-torrodial passive transformer laminates to mutually couple with a portion of the electric and magnetic field energy around active transformers. It is believed that the electric and magnetic fields contain undesirable harmonics that can negatively interact with the music waveform. To be beneficial and to reduce spurious electromagnetic fields, a device must contain a resistive element. It is insufficient for the device to merely resonate in harmony with the active electromagnetic field. Hysteresis, in the interference context, is defined as a certain varying percentage of energy loss that occurs whenever an electric field or current moves through a metal conductor. Since a resistance element is not present in the second method, only a small amount of dissipation will occur due to the inherent hysteresis.

Thus, there is a need in the art for an improvement in conventional EMI dissipation devices which can effectively dissipate self-generated and externally-generated parasitic oscillations and the resulting EMI in active audio components for improving the sound quality thereof.

SUMMARY OF THE INVENTION

The need in the art is addressed by the passive electromagnetic interference (EMI) dissipation apparatus and method of the present invention. The invention is typically utilized with an active host component to reduce self-generated and externally-generated electromagnetic interference. The passive EMI dissipation apparatus comprises a housing and a circuit located within the housing. The circuit includes a plurality of pyramidal-shaped resonating chambers having internally conductive surfaces covered with a layer of electrically resistive material, a plurality of quartz resonators each mounted upon a damping compound, and a plurality of permanent magnets each including a magnetically permeable bar. The electromagnetic interference is dissipated in the circuit over a broad range of frequencies in the form of heat.

In a preferred embodiment, the plurality of permanent magnets and the corresponding plurality of permeable bars are mounted within a common chamber located immediately below the base of each of the pyramidal-shaped resonating chambers. Each of the quartz resonators is placed upon a separate portion of viso-elastic damping compound arranged upon one of a pair of non-conductive plates. The pair of plates are then manipulated so as to sandwich the pyramidal-shaped resonating chambers and the permanent magnets and corresponding permeable bars. The sandwiched combination forms the circuit which is then positioned and sealed within the non-conductive housing.

BRIEF DESCRIPTION OF THE DRAWINGS

FIG. 5 is an inverted cross-sectional view of the microwave circuit taken along the line 5—5 of FIG. 4 showing a common chamber located between the resonating chambers and the bottom cover of the microwave circuit and the conductive film located on the walls of each resonating chamber.

FIG. 6 is an enlarged partial cross-sectional view of a quartz semi-conductor of the quartz oscillator circuit taken along line 6—6 FIG. 3 where the quartz semi-conductor is mounted on a damping compound.

FIG. 7 is a schematic diagram of an equivalent circuit showing a plurality of electrical and magnetic component combinations equivalent to the respective microwave, quartz oscillator and electric/magnetic field damping circuits of the present invention.

DESCRIPTION OF THE INVENTION

Figure 1:
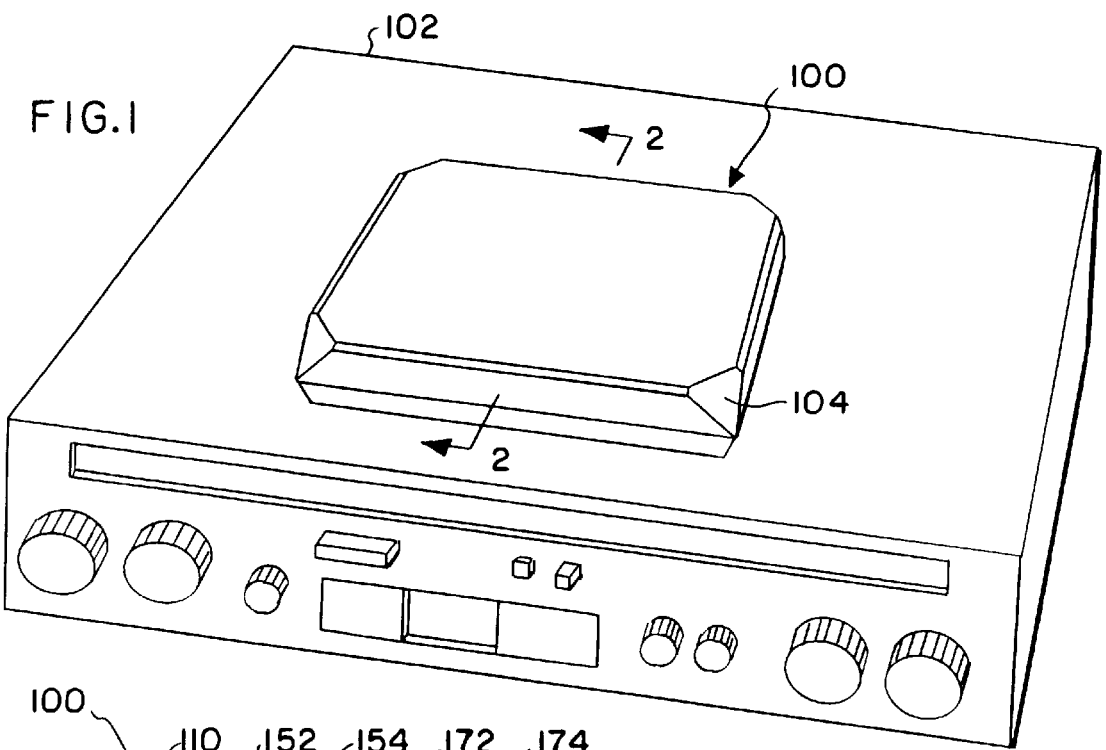
FIG. 1 is a perspective view of the passive EMI dissipation apparatus and method of the present invention showing a housing, mounted upon a host component, utilized to enclose and seal the elements of the EMI dissipation circuitry.

The present invention is a passive electromagnetic interference (EMI) dissipation apparatus 100 and method as shown in FIG. 1. The dissipation apparatus 100 is typically utilized with an active host component 102 to reduce self-generated and externally-generated electromagnetic interference. The dissipation of EMI is accomplished in a passive manner, e.g., without any electrical energy being supplied to the apparatus 100 and without any direct electrical connection between the apparatus 100 and the active host component 102.

The host component 102 can be, for example, an active audio component, digital computer hardware or medical device. The host component 102 need only be an active component capable of self-generating EMI or serving as an antenna for intercepting spurious RF, microwave, electric and magnetic fields which interfere with the processing of intelligence. For purposes of the description of the present invention hereinbelow, it will be assumed that the host component 102 is an active audio component. Examples of a suitable active audio component include pre-amplifiers, power amplifiers, compact disc players, transports, associated digital-to-analog converters and auxiliary interface devices, turn tables and audio tape recorders. The present invention serves to reduce electromagnetic interference in the active host component 102 and to improve the performance thereof.

The apparatus 100 of the present invention is a passive audio component which includes multiple internal circuit stages employed to absorb and dissipate a portion of the undesirable or parasitic oscillation effects in the electromagnetic field generated by the active host component. A general term used to describe the negative interaction of these electromagnetic spurious fields with the transfer function of the signal path circuitry (not shown) of the active host component 102 is electromagnetic interference (EMI). Therefore, the thrust of the present invention is directed to the reduction of EMI. The use of the term EMI dissipation in connection with the present invention is to be understood to encompass the absorption and reduction of spurious electromagnetic fields that can contribute to EMI.

Figure 2:
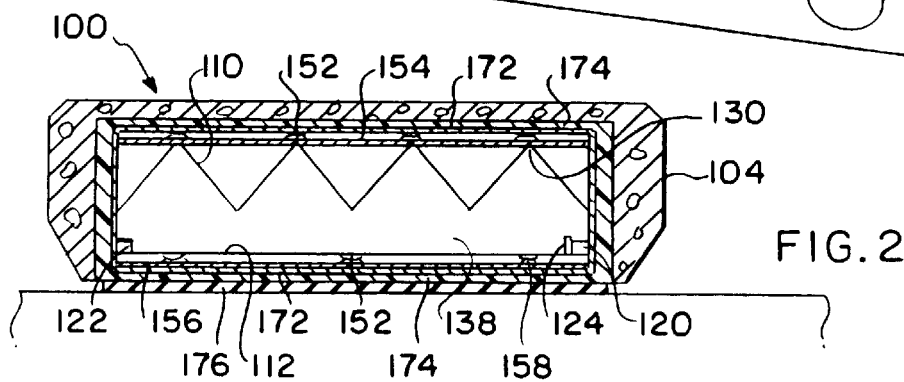
FIG. 2 is a cross-sectional view of the passive EMI dissipation apparatus taken along the line 2—2 of FIG. 1 showing portions of the microwave, quartz oscillator and electric/magnetic field damping circuits of the EMI dissipation circuitry.

The apparatus 100 includes an outer housing or case 104 that encapsulates the multiple internal circuit stages. The outer housing 104 as shown in FIGS. 1 and 2 is comprised of a poured stone concrete material. The outer housing 104 is a dehydrated reconstituted concrete that is reformed by adding liquid, is not electrically conductive and is not resistive to the electromagnetic fields generated by the host component 102. The composition of the outer housing 104 enables the parasitic fields of the EMI to easily penetrate through to the multiple internal circuit stages sealed therein and to dissipate energy that has been converted to heat. A suitable composition of dehydrated concrete is available from U.S. Gypsum Co. of Chicago, Ill. Integral pigmentation throughout the poured stone concrete material is accomplished by mixing a color additive to the reconstituted concrete material.

The mechanism that activates the absorption and dissipation circuits of the present invention has an electrical equivalent that is analogous to RF transformer action, e.g., when a passive tuned secondary coil is placed in proximity to an active primary coil, energy transfer occurs. Absorption of energy will occur at predetermined frequencies if the passive secondary coil is resistively loaded or damped properly. In the analogy, the host component 102 represents the active coil and the passive EMI dissipation apparatus 100 represents the passive tuned secondary coil. The passive EMI dissipation apparatus 100 incorporates three internal circuit stages each absorbing and dissipating EMI in three separate frequency ranges along the electromagnetic spectrum. By utilizing three internal circuit stages operating in three separate frequency ranges, the absorption and dissipation efficiency of the apparatus 100 is maximized. Although the circuitry of the host component 102 is physically isolated from the three internal circuit stages of the dissipation apparatus 100, they are coupled electromagnetically. Thus, the three internal circuit stages of the dissipation apparatus 100 are dynamically interactive with the electromagnetic fields of the host component 102.

Figure 3:
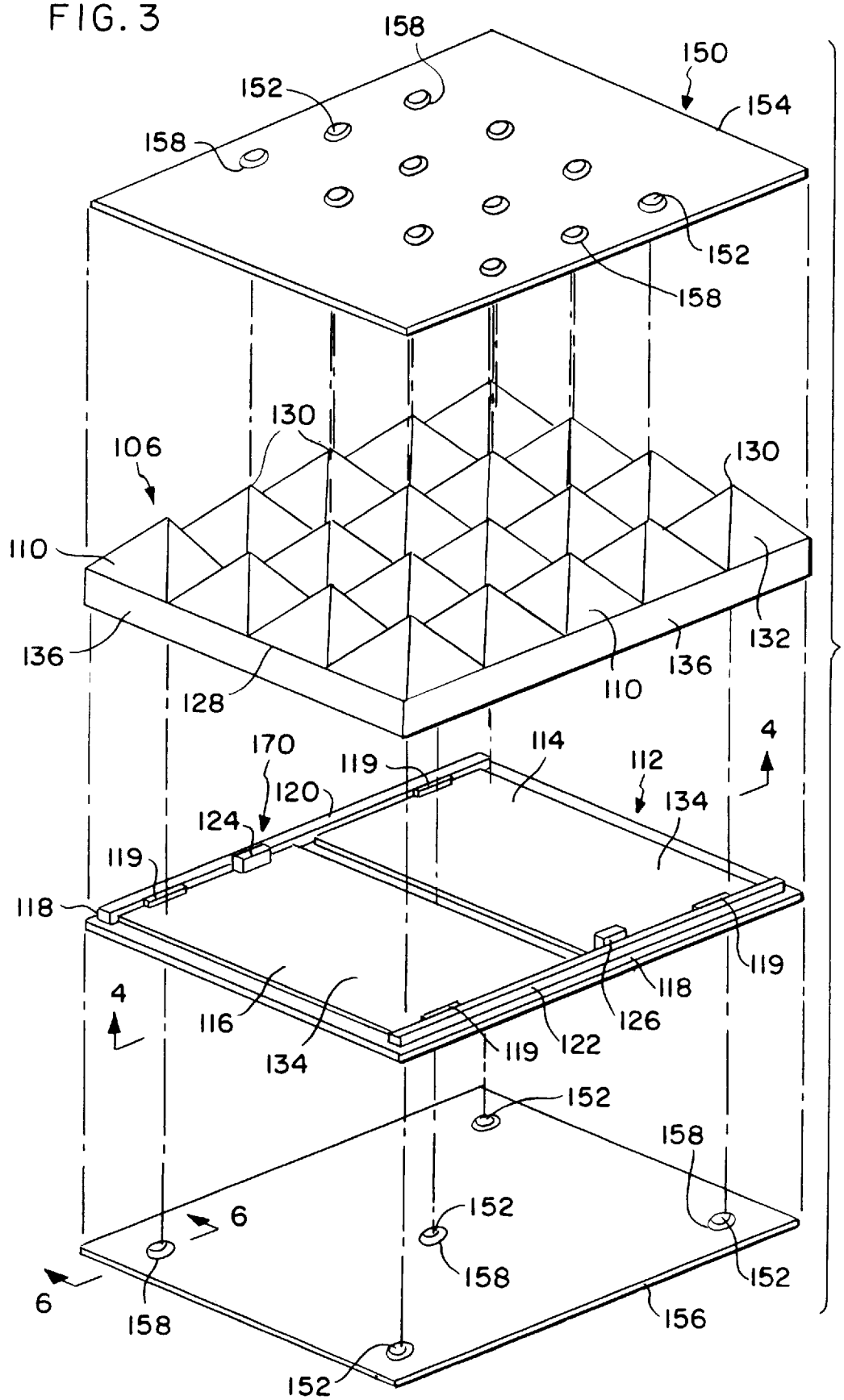
FIG. 3 is an exploded view of the circuitry of the passive EMI dissipation apparatus of FIG. 1 showing the microwave circuit positioned adjacent to the electric/magnetic field damping circuit with the microwave and electric/magnetic field damping circuits sandwiched between the top and bottom portions of the quartz oscillator circuit.

The three internal circuit stages will now be described in detail and as illustrated in the drawing FIGS. The first internal circuit stage is a microwave circuit 106 which absorbs and dissipates EMI frequencies in the range of from 1.5 GigaHertz (GHz) to 100 GHz. These EMI frequencies can be self-generated by the host component 102 or any external source. The microwave circuit 106 is comprised of a plurality of resonating chambers 110 as best shown in FIG. 3. The plurality of resonating chambers 110 are pyramid-shaped and include a base portion 112. The pyramid-shaped chambers 110 and the base portion 112 can be comprised of plastic or metal and aligned during assembly via a pin and sleeve arrangement (not shown). A suitable adhesive can be employed to hold the pyramid-shaped chambers 110 to the base portion 112. The adhesive can be spot located along the interface of the pyramid-shaped chambers 110 and the base portion 112 so that a space or gap 108 is present to facilitate the entry of electromagnetic fields having frequencies within the microwave range.

Figure 4:
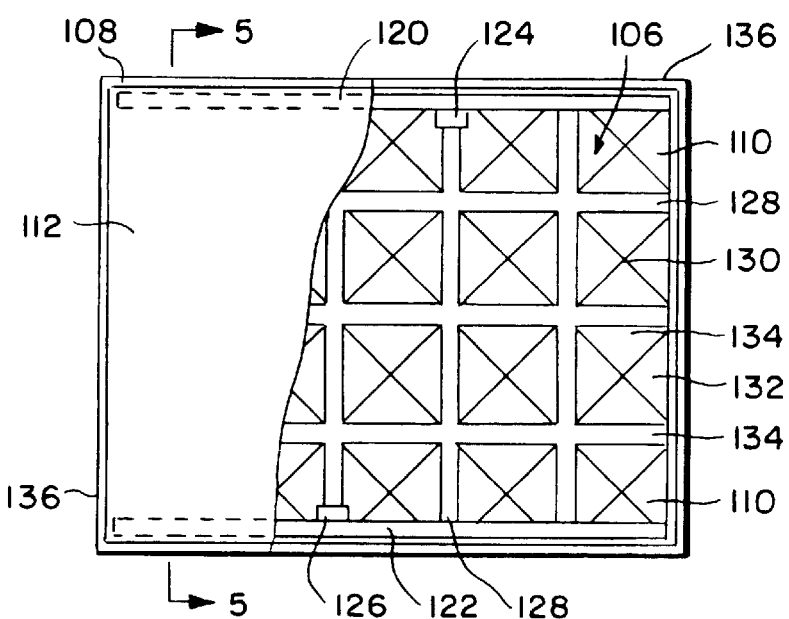
FIG. 4 is a bottom plan view of the microwave circuit partially fragmented to show the inner surface of the resonating chambers and the under surface of the bottom cover of the microwave circuit.

The base portion 112 serves to seal the open bottom of the pyramid-shaped resonating chambers 110 as best shown in FIG. 4. The base portion 112 includes two rectangular-shaped raised sections 114 and 116 that divide the base portion 112 in half. A ledge 118 is located along the perimeter of the two raised sections 114 and 116. The height of the ledge 118 is lower than that of the raised sections 114 and 116 and includes a plurality of guides 119 positioned along the longer dimension of the base portion 112 for supporting a pair of permeable iron bars 120 and 122. The iron bars 120 and 122 are adhered to the base portion 112 as by an adhesive. Mounted on the inboard side of the opposing raised sections 114 and 116, respectively, and adhered to the corresponding iron bars 120 and 122 is a pair of permanent magnets 124 and 126, respectively. The permanent magnets 124 and 126 are arranged so that their respective fields are additive. When the base portion 112 is fitted onto the bottom of the pyramid-shaped chambers 110, the permeable iron bars 120 and 122 and the magnets 124 and 126 are enclosed within the plurality of resonating chambers 110 (see exploded view of FIG. 3). The bottom of the base portion 112 is smooth as is shown in FIG. 4.

The plurality of pyramid-shaped resonating chambers 110 serves as the top portion of the microwave circuit 106. An exemplary embodiment of the pyramid-shaped chambers 110 is illustrated in FIGS. 2, 3, 4 and 5. The plurality of resonating chambers 110 is comprised of twenty pyramid-shaped custom designed chambers formed in a 4×5 ordered structure. Thus, the plurality of resonating chambers 110 has a length of five and a width of four pyramid-shaped chambers where each pyramid-shaped chamber 110 is identical and can be fashioned from either plastic or metal. Each of the pyramid-shaped chambers 110 includes a pyramid structure from the base 128 to the apex 130 as shown in FIGS. 3 and 4. Thus, each of the walls 132 on the inside of each of the pyramid-shaped chambers 110 are triangular-shaped and not parallel to any other wall. This design increases the lossy nature of the plurality of pyramid-shaped chambers 110 and improves the efficiency of dissipation of the EMI within the appropriate range of frequencies.

The pyramid-shape of the plurality of chambers 110 in combination with a resistive coating 134 placed on the triangular-shaped inside walls 132 and base 128 of the chambers 110 and on the top surface of the base portion 112 increase the electrically resistive parameters. An example of a suitable resistive coating includes a metallic type conductive carbon based paint. Carbon is highly resistive (e.g., 100 Ω/square unit) which causes microwave frequencies to be dissipated. Although microwaves are comprised of high frequencies at low power, sufficient dissipation will occur to eliminate a portion of the EMI in the microwave range which is in the vicinity of the host component 102. Thus, the triangular-shaped inside walls 132 of the pyramid-shaped chambers 110 have conductive surfaces with electrically resistive parameters to increase the impedance to EMI in the microwave range trapped within the pyramid-shaped chambers 110. The increased electrically resistive parameters result in higher dissipation of the electromagnetic fields that create the interference.

Each of the pyramid-shaped chambers 110 has identical dimensions. Each chamber base 128 is a square wherein the maximum length and width dimensions are each 0.88" or 2.235 cm (see FIG. 4). Further, the angle of slope of each of the triangular-shaped walls 132 is approximately 51.25°. The angle of slope is best shown in FIG. 5. The depth, e.g., the distance between the base 128 and apex 130 is determined by the tangent of the angle and the base dimension as follows:

$$Depth = \text{Tan } 51.25° \times (0.88"/2) = 0.5482" \qquad [1]$$

Physical measurement of the distance between the base 128 and the apex 130 of the pyramid-shaped chambers 110 was determined to be 0.55". Although exemplary for purposes of the preferred embodiment, these dimensions enable each of the pyramid-shaped chambers 110 to function as a microwave filter.

Surrounding the plurality of pyramid-shaped chambers 110 of the microwave circuit 106 and integrally formed therewith is a skirt 136 as is best shown in FIG. 5. The skirt 136 extends downward from the pyramid-shaped chambers 110 to mate with the base portion 112. Located between each base 128 of the pyramid-shaped chambers 110 and the base portion 112 is a common chamber 138. The common chamber 138 is a single box-shaped chamber positioned below and shared by each of the twenty pyramid-shaped chambers 110. In effect, each of the pyramid-shaped chambers 110 exhibits dimensions characteristic of a larger chamber. This is because each pyramid-shaped chamber 110 incorporates the common chamber 138 from a different position. Thus, none of the pyramid-shaped chambers 110 exhibit the same shape indicating that the number of frequencies that will be absorbed and dissipated in the twenty pyramid-shaped chambers 110 is maximized.

Using microwave principles, the microwave circuit 106 enables absorption and dissipation of frequencies as low as 1.5 GHz to a maximum in excess of 100 GHz. A computation can be completed to determine the low frequency cutoff point, e.g., the lowest frequency that will resonate at the bottom of each of the pyramid-shaped chambers 110. In effect, the computation determines the lowest frequency at which the pyramid-shaped chambers 110 will absorb and dissipate interference from the electromagnetic fields propagated by the host component 102.

The following information is a prelude to the calculation of the low frequency cutoff point of the plurality of pyramid-shaped chambers 110. The resonant standing wave pattern of electromagnetic fields in the pyramid-shaped resonating chambers 110 results from the interference pattern produced by the superposition of various waves reflected from the triangular-shaped walls 132 of the resonating chambers 110. Resonance is a multiple of half guide wavelengths. A particular cavity, e.g., pyramid-shaped chambers 110, of fixed shape and size will have many different modes corresponding to all the wave types that may exist in the corresponding waveguide and to different numbers of half waves between shorting ends.

It is required that the cavity, e.g., pyramid-shaped chambers 110, have internal conducting surfaces such as the triangular-shaped walls 132. A gap in the cavity is necessary to introduce an electric field. In the present invention, the gap 108 is located at the interface of the skirt 136 of the pyramid-shaped chambers 110 and the base portion 112 as shown in FIGS. 4 and 5. Entry of the microwaves to be dissipated is enabled through the gap 108 around the interface that partially seals the pyramid-shaped chambers 110.

Resonance frequency is determined by the length and width dimensions of the pyramid-shaped resonating chambers 110 seen by the electric field. The length and width of the base 128 of each of the pyramid-shaped chambers 110 are each equal to 0.88" or 2.235 cm. If the angle of phase velocity of the frequency Sin φ is neglected and if permeability ($\mu$) and permativity ($\epsilon$) are each assumed to be 1, then the frequency at which the low frequency cutoff point occurs can be calculated as follows.

$$f = (3 \times 10^8)/2d \ (\mu\epsilon \ \text{Sin} \ \phi)^{\frac{1}{2}} \quad [2]$$

where the measurement of the base chamber dimension "d"=0.0235 meters and the quantity $(\mu\epsilon \ \text{Sin} \ \phi)^{1/2}=1$. The cutoff frequency is then equal to $$f=6.711 \ \text{GHz} \quad [3]$$

The cutoff frequency is the lowest frequency that will resonate at the bottom of each of the pyramid-shaped chambers 110. Likewise, it is the lowest interference frequency propagated by the electromagnetic fields of the host component 102 that can be absorbed and dissipated by the dissipation apparatus 100.

In equation [2], the phase velocity was neglected. However, if the phase velocity is taken into consideration, the low frequency cutoff point is reduced to a value of 9.48 GHz. If the common chamber 138 is included in the calculations in equations [2] and [3] above, then the low frequency cutoff point is further reduced or lowered by a factor of one-fifth and one-fourth. This reduction occurs because of the design layout of the pyramid-shaped chambers 110, e.g., the 4x5 ordered structure of pyramid-shaped chambers 110 is not a uniform square cluster.

In contrast to the low frequency cutoff point, the upper range of EMI frequency absorption by the microwave circuit 106 is determined by the geometry of the pyramid-shaped chambers 110. The narrowing pyramid-shaped geometry of the resonating chambers 110 results in an exceptionally broad sampling of higher and higher frequency wavelengths moving toward the apex 130 of the resonating chambers 110. This construction results in an infinite continuum of higher frequencies that can be absorbed by the resonating chambers 110.

Microwaves can easily penetrate the outer non-conductive stone housing 104 but require an entry port, e.g., the gap 108, to the pyramid-shaped chambers 110. This is because the pyramid-shaped chambers 110 exhibit a conductive inner surface that restricts the entry of microwaves. This conductive inner surface is the essential resistive coating 134 that converts the undesirable microwave energy into heat. When the microwave energy enters the chamber through the gap 108, it becomes trapped and bounces around the non-parallel, lossy triangular-shaped walls 132 creating currents that are converted into heat as they pass through the resistive coating 134.

The second internal circuit stage is a quartz oscillator circuit 150 which absorbs and dissipates frequencies in the range of from 500 KiloHertz (KHz) to 50 MegaHertz (MHz). These EMI frequencies within the Radio Frequency (RF) range can be self-generated by the host component 102 or any external source. The quartz oscillator circuit 150 is comprised of a plurality of quartz resonators 152 distributed over a pair of non-conductive plates 154 and 156, respectively, as shown in FIG. 3. The plurality of quartz resonators 152 are the absorption and dissipation medium utilized in the quartz oscillator circuit 150. Being a piezeo-electric material, quartz is capable of converting an electric field into mechanical energy and reversing the conversion.

Typically, the desired goal when employing quartz in an active circuit is to accentuate one resonance to the exclusion of many others. In contrast, quartz is used in the present invention in a manner to produce the broadest sampling of frequencies in each individual quartz crystal. To accomplish this goal, quartz material of natural origin and of irregular shape is the material of choice. In addition, a varied sampling of quartz crystals of different dimensions relative to other quartz crystals are included to further maximize the frequencies that will be effected. It is noted that the varied sampling of quartz crystals fall within predetermined boundaries to maintain unit-to-unit accuracy. This practice results in an extremely broad multitude of mutually coupled resonant modes to the somewhat unpredictable EMI frequencies.

In conventional practice, quartz wafers are laboratory grown without irregularities to provide a quartz crystal that produces a single oscillation frequency for use with, for example, a time piece or computer hardware. When employed in the passive circuit of the present invention, the quartz crystal is utilized to resonate at as many frequencies as possible. This practice provides the broadest bandwidth of oscillators. In order to accomplish this objective and to maximize conversion of electrical energy to mechanical energy, only quartz of a very pure piezeo-electric type is utilized. The quartz crystals selected for use in the passive circuit have irregular and non-uniform shapes, e.g., the quartz crystals have a variety of shapes and sizes. Furthermore, the quartz crystals have no inclusions, e.g., clear quartz crystals which also facilitates the absorption and dissipation of a variety of very high frequencies.

Passive quartz crystals will initiate oscillation in the crystal lattice when they communicate with an electromagnetic field which oscillates over a range of frequencies that is mutual with the range of frequencies that initiate oscillation in the quartz crystals. Since it is the thickness dimension of the quartz crystal that determines what range of frequencies the crystal will oscillate at, multiple irregularly-shaped crystals will oscillate at different frequencies.

In the present invention, seventeen quartz resonators 152 are employed in the quartz oscillator circuit 150. A total of twelve quartz resonators 152 are distributed in an ordered manner over three rows of four crystals each on the top surface of non-conductive plate 154 as shown in FIG. 3. Each of the twelve upward-facing crystals distributed on the top surface of non-conducting plate 154 are positioned directly over the apex 130 of the correspondingly positioned pyramid-shaped resonating chambers 110 of the microwave circuit 106. The non-conductive plate 154 actually sits directly upon the apex 130 of each of the pyramid-shaped resonating chambers 110 after assembly of all components as shown in FIG. 2.

The remaining five quartz resonators 152 are distributed on the top surface of the non-conductive plate 156. A single quartz resonator 152 is positioned in each of the four corners and one resonator 152 is positioned at the center of the non-conductive plate 156. Four of the quartz resonators 152 distributed on plate 156 face upward into the four corner resonating chambers 110 and one quartz resonator 152 faces upward into the center of the plurality of resonating chambers 110 as is shown in FIG. 3. The non-conductive plate 156 with the five quartz resonators 152 mounted thereon is positioned directly beneath the bottom surface of the base portion 112 of the microwave circuit 106 as shown in FIGS. 2 and 3.

The distribution of the plurality of quartz resonators 152 over the non-conductive plates 154 and 156 has been determined to provide the optimum absorption and dissipation of EMI within the frequency range of interest based upon testing. Since each quartz resonator 152 is oscillating at a multitude of different frequencies (because of the irregular surface of each of the resonators), it would seem logical that the number of quartz resonators 152 should be maximized in order to absorb and dissipate the broadest range of frequencies. Conversely, a maximum permissible distance must exist between each of the quartz resonators 152 on non-conductive plate 154 to ensure the performance of each individual resonator. For example, the quartz resonators 152 should not touch one another since touching of adjacent resonators 152 tends to cancel the EMI absorption contributions of each resonator 152.

Therefore, with respect to the non-conductive plate 154, the quartz resonators 152 must be spaced to maximize the number of quartz resonators 152, the distance between adjacent resonators 152 and the performance of the quartz resonator circuit 150 in absorbing and dissipating EMI within the appropriate range of frequencies. This requirement has been met by extensive trial and error testing methods. With respect to the non-conductive plate 156, the distribution of the remaining five quartz resonators 152 not only maximizes the performance of the quartz resonator circuit 150 but also provides space for the addition of quartz crystals to absorb and dissipate EMI.

If a medium is converting energy from one form to another, e.g., such as the quartz resonators 152, the degree to which the energy in the conversion is lost or not lost can be quantified. This is accomplished by a measurement known as the "Q" of the medium. With respect to the quartz resonators 152, the "Q" is a measure of the efficiency of the energy conversion from electrical to mechanical and the reversal thereof. It is known that the "Q" of quartz is extremely high. Consequently, quartz will convert electrical frequencies to mechanical energy and back to electrical energy before the mechanical energy can be dissipated.

The efficiency of conversion of quartz between electrical and mechanical energy states typically impedes the absorption and dissipation of electromagnetic fields. It is a mistake to assume that the conversion of electric fields to mechanical modes will satisfy the dissipation portion of the quartz oscillator circuit 150. This problem has been solved in the present invention by effectively lowering the "Q" of the quartz resonators 152 by damping the oscillations of the quartz resonators 152. Careful experimentation of a variety of damping compounds resulted in a choice of material that sufficiently lowers the "Q" of the quartz to an acceptable resistive range. By using the damping compound, there is a sharp reduction in amplitude of the mechanical energy within the first half-cycle of mechanical oscillations before the quartz resonator 152 can reconvert the mechanical mode back to electrical energy. Therefore, the quartz oscillator circuit 150 bears similarity to the transformer effect in the microwave circuit 106 wherein a mutual coupling of frequencies absorbs a percentage of undesirable EMI in the host component 102.

Each of the quartz resonators 152 is mounted upon a cushion of viso-elastic rubber putty damping compound 158 as is clearly shown in FIG. 3 but shown best in FIG. 6. The damping compound 158 is a non-hardening, non-toxic, reusable, pliable, inexpensive rubberized material utilized to hold each quartz resonator 152 in position on the non-conductive plates 154 and 156, respectively. The viso-elastic rubber putty damping compound 158 is available from DAP, Inc. of Dayton, Ohio.

The damping compound 158 also functions to solve the quartz high "Q" problem. When the quartz resonators 152 are exposed to interference frequencies, the resonators 152 begin to oscillate. The high "Q" of the quartz resonators 152 efficiently convert the electrical EMI frequencies to mechanical energy. The mechanical vibrations associated with the conversion are damped by the viso-elastic rubber putty damping compound 158 within the first half-cycle of mechanical vibrations. The reduction in the "Q" of the quartz resonators 152 permits the absorption and dissipation of a portion of the mechanical vibrations. Thereafter, the quartz resonators are prepared to dissipate mechanical energy in the next wave of EMI frequencies.

The frequencies at which a given quartz resonator 152 will oscillate is determined by the thickness of the quartz crystal. Individual pieces of quartz are employed as the quartz resonators 152 which have, within a single piece of quartz, a thickness dimension that ranges from 0.01" to 0.1". This is because the dimensions of each quartz resonator 152 are irregular. The formula for determining the frequency that a given piece of quartz will oscillate or resonate at is as follows:

$$f_n = n(K/e) \quad [4]$$

where "K" is referred to as the frequency constant and has the dimensions of velocity but is usually expressed in KiloHertz-inches or KiloHertz-millimeters or MegaHertz-mils. The value of the frequency constant employed in equation [4] is a function of the type of the quartz piezoid. The term "e" is the thickness of the quartz crystal and is a varying quantity. Thus, to determine the resonant frequency ($f_n$) of a quartz resonator 152, the frequency constant (K) is divided by the thickness of the quartz crystal.

In the microwave circuit 106, a low frequency cutoff point was calculated. In the same manner, a low end cutoff frequency can be determined by the thickest dimension of the quartz crystal in the quartz oscillator circuit 150. Likewise, the upper ranges of frequency modes are computed by considering the continuum of smaller and smaller values for the thickness dimension across the length of the quartz crystal. The significance of utilizing quartz crystals exhibiting an irregular thickness dimension is that it provides as broad a band receptor as possible. This characteristic provides the benefit of absorption and dissipation of a broader range of EMI frequencies within the host component 102. The obvious shortfall of conventional laboratory grown quartz wafers in the EMI absorption and dissipation application is their singular resonant mode. A singular resonant mode fails to cover the broad and somewhat unpredictable component-to-component variances in frequencies of self-generated RFI.

In the present invention, the frequency constant K is expressed in MegaHertz-mils and can vary over the range of (50 to 112.1) depending upon the cut of the quartz. For example, the constant 65.5 is used for type AT-cut quartz. In the quartz oscillator circuit 150, solid natural quartz of variable thickness which is not connected to electrodes and does not have a particular orientation is utilized. As a result, these quartz crystals are not being forced into a singular mode. To approximate the range of frequencies that quartz crystals of this type will oscillate at, the typical procedure is to divide the range of thickness parameters into constants for all of the numbers between 50 and 100 rather than use a single constant (K). These calculations will provide a low frequency cutoff value and a high frequency cutoff value. Also, a large number of resonant modes falling in between the low and high frequency cutoff values are determined for a single piece of quartz. Since there are seventeen quartz resonators 152, many different frequencies fall within the range of the quartz oscillator circuit 150.

The low frequency cutoff computation based upon equation [4] above considering a quartz crystal having a maximum thickness of 0.1" and a frequency constant of 50 mega-mils provides a low frequency cutoff measurement of $$f_n = 50 \text{ mega-mils}/0.1" = 500 \text{ KHz} \quad [5]$$

If the quartz crystal has a minimum thickness of 0.01" and a frequency constant of 100 mega-mils, then according to equation [4], the high frequency cutoff measurement is $$f_n = 100 \text{ mega-mils}/0.01" = 10 \text{ MHz} \quad [6]$$

The high frequency cutoff limit for the quartz resonators 152 can then be determined by multiplying the 10 MHz frequency value by the factor 5 which represents the fifth overtone. Thus, the low and high frequency cutoff values for the quartz resonators 152 have been established.

The third internal circuit stage is an electric/magnetic field damping circuit 170 which absorbs and dissipates frequencies by filter action in the range of 50 Hz to 200 KHz. These potential EMI frequencies can be self-generated by the electromagnetic fields of the host component 102 comprised of electric or electrostatic fields or any other external source. Thus, any magnetic fields that pass through the chassis of the host component 102 would also be dissipated by this third stage. However, most magnetic fields would likely be attenuated by the metal chassis of the host component 102.

The electric/magnetic field damping circuit 170 is comprised of the pair of permeable iron bars 120 and 122 and the pair of permanent magnets 124 and 126, respectively, as previously noted during the discussion of the microwave circuit 106. The permanent magnets 124 and 126 are each iron boron neo-dymiun fixed magnets having a magnetic strength of 2.78 KiloGauss. The permeable iron bars 120 and 122 and the permanent magnets 124 and 126 are clearly shown in FIGS. 3 and 5.

The pair of permanent magnets 124 and 126 are affixed as by glue to the base portion 112 and thus are fixed in position. The corresponding permeable iron bars 120 and 122 are glued to the ledge 118 of the base portion 112 in physical communication with the permanent magnets 124 and 126. The permeable iron bars 120 and 122 serve to provide a path to expand the magnetic lines of flux of each of the permanent magnets 124 and 126. This arrangement expands the magnetic fields of the permanent magnets 124 and 126. The pair of iron bars 120 and 122 also function as the equivalent of an antenna, e.g., analogous to an iron core of a transformer, in that they attract a portion of the spurious fields from the active power transformer (not shown) within the host component 102. This arrangement results in greater coupling of the electromagnetic fields with the electric/magnetic field damping circuit 170.

The damping mechanism of the electric/magnetic field damping circuit 170 operates in the following manner. If the magnetic flux field that is created by permanent magnets 124 and 126 comes into the proximity of an electric field of the type produced by active component power supplies, the intersection will result in an energy exchange. The electric field can contain multiple odd harmonics of the alternating current line fundamental frequency (e.g., 60 Hz). If the electric field having multiple odd harmonics enters the environment of the magnetic flux field of the fixed permanent magnets 124 and 126, the electric field will attempt to move or modulate the flux value of the magnetic field. Thus, the electric field will attempt to cause a simple sine wave to compensate or ride up on a straight forward constant flux value.

Electric fields and magnetic fields are orthogonal to one another. Relative motion between the two fields result in the production of force. Because the permanent magnets 124 and 126 are fixed in position (e.g., unmovable), any effort to move the fixed magnetic flux of the permanent magnets 124 and 126 requires energy expenditure. The moving electric field from the host component 102 will apply a force to the permanent magnets 124 and 126 in an attempt to move them. Since the permanent magnets 124 and 126 are fixed (e.g., glued) in position, the electric field expends a portion of its energy in the permanent magnets 124 and 126 in the form of heat. This conclusion is in complete accord with the well known Right Hand Rule which describes the interaction and mechanical motion resulting from an electric field intersecting a magnetic field.

An electrical diagram which is an equivalent of the passive EMI dissipation apparatus 100 is disclosed in FIG. 7. The equivalent of each of the three stages of the dissipation apparatus 100 are shown in FIG. 7 including the microwave circuit 106, the quartz oscillator circuit 150 and the electric/magnetic field damping circuit 170 in addition to the host component 102. The equivalent of the microwave circuit 106 is comprised of a plurality of equivalent inductive (L), capacitive (C) and resistive (R) components. In particular, the parallel combinations of an equivalent inductor 180 and an equivalent capacitor 182 are the equivalent to the pyramid-shaped resonating chambers 110. Further, an equivalent resistor 184 shown is the equivalent to the resistive carbon coating 134 located on the inner conducting surface of the pyramid-shaped resonating chambers 110 inside the microwave circuit 106.

The equivalent of the quartz oscillator circuit 150 is comprised of a plurality of equivalent inductive (L), capacitive (C) and resistive (R) components. In particular, the parallel combinations of an equivalent inductor 186 and an equivalent capacitor 188 are the equivalent to the plurality of quartz resonators 152. Further, an equivalent resistor 190 shown is the equivalent to the viso-elastic rubber putty damping compound 158 which is located external to the quartz resonators 152. Thus, the equivalent resistor 190 is shown positioned outside of the dashed boxes identified with number 150 in FIG. 7 to indicate the equivalent of the quartz oscillator circuit 150.

The equivalent of the electric/magnetic field damping circuit 170 is comprised of a parallel arrangement of equivalent permeable iron bars 191 and 192 and equivalent permanent magnets 193 and 194, respectively. A pair of equivalent antennas 195 and 196 which serve to attract spurious fields are shown attached to the equivalent permeable iron bars 191 and 192. Also included are a pair of equivalent resistors 197 and 198, each connected to electrical ground, which serve to symbolize the equivalent force applied by the electric field of the host component 102 on the equivalent permanent magnets 193 and 194, respectively.

Finally, the equivalent of the host component 102 is comprised of an equivalent series combination of an equivalent active device 160, an equivalent passive device 162, an equivalent power supply 164 and a plurality of equivalent inductors 166. The equivalent of the host component 102 is shown as a separate structure independent of any electrical or mechanical connection with the equivalents of the microwave circuit 106, the quartz oscillator circuit 150 and the electric/magnetic field damping circuits 170.

The three stages including the microwave circuit 106, the quartz oscillator circuit 150 and the electric/magnetic field damping circuit 170 are then placed upon one another in the order shown in the exploded view of FIG. 3. The entire combination is then wrapped with a tape 172 having one sticky side and one non-sticky side similar to common masking tape. Once wrapped in the tape 172, the combination of the microwave circuit 106, the quartz oscillator circuit 150 and the electric/magnetic field damping circuit 170 appears as a rectangular structure which can be moved about as a single unit. The tape 172 prevents liquid from entering the three circuit stages wrapped therein and forms a barrier between the three circuit stages and a potting compound 174 as described hereinbelow. A suitable product for the tape 172 is available from The 3M Corporation of Minneapolis, Minn.

The potting compound 174 is a liquid which is poured into the hollow outer housing 104 when in the upside-down position. The potting compound 174 is utilized to isolate the three circuit stages wrapped in the tape 172 from the inside surface of the outer housing 104. The potting compound, which is known in the art, is an electrically inert insulator comprised of a fast setting polyurethane sealing material. Once mixed, the potting compound 174 sets when exposed to air. Both the tape 172 and the potting compound 174 are clearly shown in cross-section in FIG. 2.

During assembly, the outer housing 104 as shown in FIG. 2 is turned in the upside-down position exposing a hollow interior. A small volume of the potting compound 174 is poured into the outer housing 104. The three circuit stages (including the microwave circuit 106, the quartz oscillator circuit 150 and the electric/magnetic field damping circuit 170) wrapped in the tape 172 are placed within the outer housing 104. The taped circuit stages are oriented in the outer housing 104 so that they appear as shown in FIG. 2 when the outer housing 104 is placed right-side-up position.

After the small volume of potting compound is permitted to set, the remainder of the hollow interior of the outer housing 104 is filled with potting compound 174 and permitted to set in air. The potting compound 174, after it is set, becomes a black semi-shiny surface completely surrounding and hiding the three circuit stages therein. The tape 172 prevents the potting compound 174 from entering the space between the three circuit stages. Further, since the tape 172 does not have a release agent, no adverse chemical reaction occurs between the potting compound 174 and the tape 172. Once the potting compound 174 is set, a thin neoprene rubber pad 176 is affixed to the top black surface of the potting compound 174 (e.g., to the bottom of the outer housing 104 when in the right-side-up position). The rubber pad 176 has a ribbed surface to increase the gripping capability of the dissipation apparatus 100 and to protect the top surface of the host component 102 from the concrete outer housing 104.

In operation, the dissipation apparatus 100 is passive requiring no electrical connection or source. An active component 102 is selected upon which the dissipation apparatus 100 is to be placed. The optimum location upon the host component 102 for placement of the dissipation apparatus 100 is directly above the element of the host component 102 that is known to generate EMI frequencies. An example of such a location would be directly above the power transformer (not shown) of the host component 102. In this manner, the absorption and dissipation stages of the dissipation apparatus 100 are then close to an area of the host component 102 that is prone to self-generated EMI. Movement of the dissipation apparatus 100 about the top of the host component 102 may be required in order to achieve the best results.

It should be noted that the three internal circuit stages are not interdependent upon one another. Thus, the microwave circuit 106, the quartz oscillator circuit 150 and the electric/magnetic field damping circuit 170 will each function to absorb and dissipate interference from electromagnetic fields of the host component 102 in the absence of the other stages. However, the frequencies normally addressed by the absence stage would not be absorbed and addressed.

The dissipation apparatus 100 of the present invention provides advantages over the prior art in several distinct ways. Initially, there are three distinct circuit stages that cover a broader source of potential undesirable emanations. Second, new and unique types of absorption components (e.g., the resonating chambers 110, the quartz resonators 152 and the permanent magnets 124 and 126 and permeable bars 120 and 122) are incorporated in the present invention. Even when utilized with other filter designs (e.g., ferrite types), the multiple stages of the dissipation apparatus 100 compliment rather than duplicate the dissipation action. Thus, this design will provide additional benefits over those known in the prior art. The present invention 100 also allows for flexible placement near the internal circuit stages (not shown) of the host component 102 that are most prone to self-generated EMI as well as providing additional noise reduction from externally generated interference. Finally, each of the three circuit stages of the present invention not only has the inherent hysteresis effect that produces some dissipation but also incorporates an additional resistive element to enhance the effectiveness of the filter stages.

While the present invention is described herein with reference to illustrative embodiments for particular applications in active audio components, it should be understood that the invention is not limited thereto. Those having ordinary skill in the art and access to the teachings provided herein will recognize additional modifications, applications and embodiments within the scope thereof and additional fields such as the digital electronic, computer and medical fields in which the present invention would be of significant utility.

It is therefore intended by the appended claims to cover any and all such modifications, applications and embodiments within the scope of the present invention.

Accordingly,

What is claimed is:

1. A Passive apparatus for dissipating electromagnetic interference comprising:

a housing flexibly placed external to a host component;

a passive circuit located within said housing for passively absorbing and dissipating radiated electromagnetic interference over a broad range of frequencies, said passive circuit comprising a plurality of non-uniform, irregularly-shaped quartz resonators each mounted upon a rubberized viso-elastic damping compound, said electromagnetic interference being dissipated as heat within said passive circuit.

2. The apparatus of claim 1 wherein said housing is comprised of a poured stone concrete material.

3. The apparatus of claim 1 wherein said passive circuit for dissipating radiated electromagnetic interference further includes a plurality of pyramid-shaped resonating chambers positioned over a common chamber.

4. The apparatus of claim 1 wherein said quartz resonators passively dissipate radiated electromagnetic interference within the range of frequencies of from 500 Kilohertz to 50 Megahertz.

5. The apparatus of claim 3 wherein said resonating chambers have internally conductive surfaces covered with a layer of electrically resistive material.

6. The apparatus of claim 3 wherein said resonating chambers dissipate electromagnetic interference within the range of frequencies of from 1.5 GigaHertz to 100 GigaHertz.

7. The apparatus of claim 1 wherein said passive circuit for dissipating radiated electromagnetic interference further includes a plurality of permanent magnets mounted within a common chamber beneath a plurality of pyramid-shaped resonating chambers.

8. The apparatus of claim 7 wherein each of said permanent magnets being in physical communication with a magnetically permeable bar for extending the magnetic field of said permanent magnets.

9. The apparatus of claim 7 wherein said permanent magnets dissipate radiated electromagnetic interference within the range of frequencies of from 50 Hertz to 200 KiloHertz.

10. A passive apparatus for dissipating electromagnetic interference comprising:

a housing flexibly placed external to a host component;

a passive circuit located within said housing for passively absorbing and dissipating radiated electromagnetic interference, said passive circuit comprising (a) a plurality of pyramid-shaped resonating chambers positioned over a common chamber, said resonating chambers having internally conductive surfaces covered with a layer of electrically resistive material, (b) a plurality of irregularly-shaped quartz resonators each mounted upon a rubberized viso-elastic damping compound, and (c) a plurality of permanent magnets each in physical communication with a magnetically permeable bar mounted in said common chamber, said electromagnetic interference being dissipated as heat within said passive circuit over a broad range of frequencies.

11. The apparatus of claim 10 wherein said rubberized viso-elastic damping compound damps the oscillations of said quartz resonators for lowering the efficiency of energy conversion in said quartz resonators.

12. A passive apparatus for dissipating electromagnetic interference comprising:

a housing flexibly placed external to a host component;

a passive circuit located within said housing for passively absorbing and dissipating radiated electromagnetic interference over a broad range of frequencies, said passive circuit comprising a plurality of pyramid-shaped resonating chambers positioned over a common chamber, a plurality of quartz resonators each mounted upon a rubberized viso-elastic damping compound, and a plurality of permanent magnets each in physical communication with a magnetically permeable bar, said electromagnetic interference being dissipated as heat within said passive circuit.

* * * * *